United States Patent
Lee et al.

(10) Patent No.: US 8,241,928 B2
(45) Date of Patent: Aug. 14, 2012

(54) TEST STRUCTURE AND METHOD FOR DETECTING CHARGE EFFECTS DURING SEMICONDUCTOR PROCESSING

(75) Inventors: Ming-Hsiu Lee, Hsinchu (TW); Chao-I Wu, Tainan (TW); Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/777,858

(22) Filed: May 11, 2010

(65) Prior Publication Data
US 2010/0221851 A1 Sep. 2, 2010

Related U.S. Application Data

(62) Division of application No. 11/460,209, filed on Jul. 26, 2006, now abandoned.

(51) Int. Cl.
*H01L 21/66* (2006.01)
(52) U.S. Cl. .......... 438/18; 438/217; 438/216; 438/261; 257/E21.521; 257/E29.134; 257/E29.138; 257/E29.319
(58) Field of Classification Search ........... 257/E21.521, 257/465, 151, 153, 249, 320, 366, 412, E29.134, 257/E29.138, E29.319; 438/18, 217, 216, 438/261
See application file for complete search history.

(56) References Cited

U.S. PATENT DOCUMENTS

| | | | |
|---|---|---|---|
| 4,908,799 A | 3/1990 | Gaudronneau | |
| 5,338,954 A | 8/1994 | Shimoji | |
| 5,781,445 A | 7/1998 | Shiue et al. | |
| 6,028,324 A | 2/2000 | Su et al. | |
| 6,091,113 A * | 7/2000 | Tanaka | 257/355 |
| 6,143,579 A | 11/2000 | Chang et al. | |
| 6,730,967 B2 | 5/2004 | Lin | |
| 6,960,784 B2 | 11/2005 | Lin et al. | |
| 2004/0155281 A1* | 8/2004 | Osada et al. | 257/315 |
| 2005/0064645 A1* | 3/2005 | King | 438/217 |
| 2005/0111257 A1 | 5/2005 | Eitan | |
| 2005/0184334 A1* | 8/2005 | Kim et al. | 257/324 |
| 2007/0045718 A1 | 3/2007 | Bhattacharyya | |
| 2007/0076477 A1* | 4/2007 | Hwang et al. | 365/185.08 |
| 2007/0247923 A1* | 10/2007 | Ding et al. | 365/185.29 |

OTHER PUBLICATIONS

Zhao, Yuegang, "How to get accurate trap density measurements using charge pumping", Mar. 2004, Keithley Instruments, Inc., USA.

* cited by examiner

*Primary Examiner* — Marc Armand
(74) *Attorney, Agent, or Firm* — Baker & McKenzie LLP

(57) ABSTRACT

A semiconductor process test structure comprises an electrode, a charge-trapping layer, and a diffusion region. The test structure is a capacitor-like structure in which the charge-trapping layer will trap charges during various processing steps. Gate-induced drain leakage (GIDL) measurement techniques can then be used to characterize the charging status of the test structure.

19 Claims, 14 Drawing Sheets

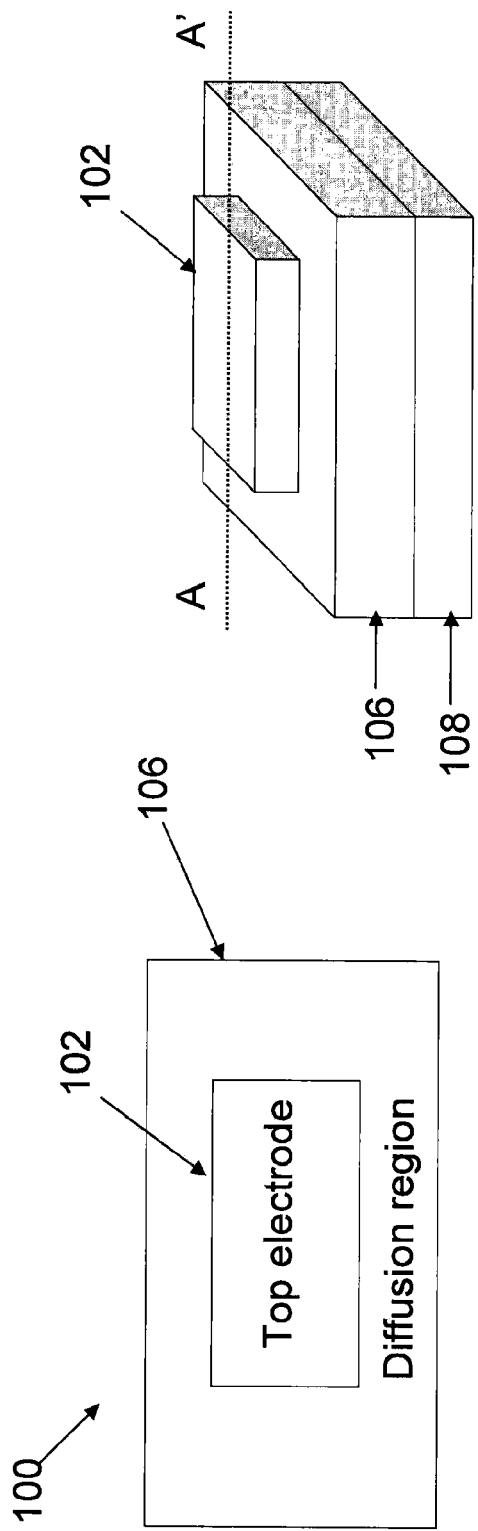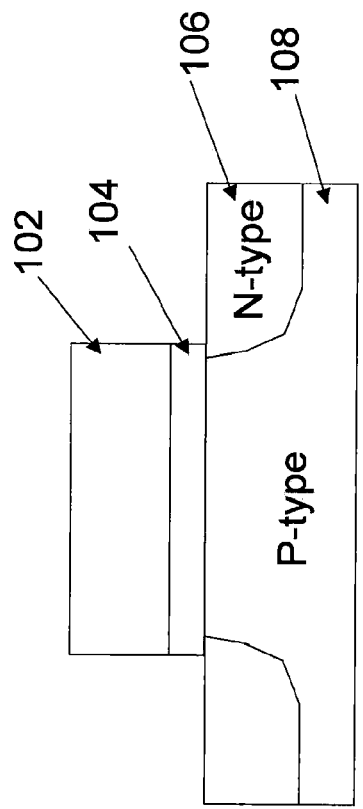
FIG. 1B
FIG. 1C
FIG. 1A

TEST STRUCTURE AND METHOD FOR DETECTING CHARGE EFFECTS DURING SEMICONDUCTOR PROCESSING

RELATED APPLICATIONS AND PRIORITY CLAIM

This application is a divisional of U.S. application Ser. No. 11/460,209, filed Jul. 26, 2006.

BACKGROUND

1. Field of the Invention

This invention relates generally to testing and diagnostics of line processes used for the manufacture of integrated circuit devices, and more particularly to the measurement and monitoring of the charging status in a gate dielectric layer or floating gate layer of a test structure during semiconductor processing steps.

2. Background of the Invention

The manufacture of large-scale integrated circuits involves hundreds of discrete processing steps. These steps are typically divided into two sub-processes. The first of these sub-processes is often referred to as the front-end of line (FEOL) sub-process during which the semiconductor devices are formed within a silicon wafer. The second of the sub-processes is often termed the back-end of line (BEOL) sub-process during which various metal interconnecting layers and contacts are formed on top of the semiconductor devices formed during the FEOL sub-process.

Many of the processing steps comprising the FEOL and BEOL sub-processes involve depositing layers of material, patterning the layers by photolithographic techniques, and then etching away unwanted portions of the deposited material. The deposited materials primarily consist of insulators and metal alloys. In some instances the pattern layer serves as temporary protective mass, while on others they are functional components of the integrated circuit chips being formed.

Radio frequency (RF) plasmas are often used in many of the processing steps, especially in the processing steps comprising the BEOL sub-process. For example, RF plasmas are used in Reactive Ion Etching (RIE), which is used to etch the layers of material as described above. RIE provides the etching anisotropy required to achieve the requisite high degree of pattern definition and precision and the requisite precision dimensional control. In RIE, gaseous chemical etching is assisted by unidirectional ion bombardment provided by an RF plasma. Photo-resist layers, used in the photolithographic patterning described above, are also frequently removed using plasma ashing.

Unfortunately, the numerous exposures to the RF plasmas, and other forms of ionic radiation, results in radiation damage and the accumulation of charge on exposed conductive components, which leads to damaging current flows and trapped charges affecting the semiconductor devices and integrated circuit chips being formed. The surfaces of the patterned semiconductor wafer present multiple areas of conductors and insulators to the RF plasmas. The multiple areas of conductors and insulators produce local non-uniformities in the plasma currents, which can result in charge build up on the electrically floating conductor surfaces. This charge build up can produce the damaging current flows and can affect the threshold voltages for semiconductor structures formed on the silicon wafer.

The semiconductor devices often comprise some form of field effect transistor comprising a gate, drain, and source regions. The gate often comprises a polysilicon electrode separated from the substrate by a gate dielectric. Charge can penetrated through the gate dielectric to the gate electrode. The mechanism of current flow through the gate oxide is primarily the result of Fowler-Nordheim (FN) tunneling. FN tunneling occurs at fields in excess of 10 MV/cm. Charge build up on the gate electrode resulting in a gate electrode potential of only 10 volts is therefore sufficient to induce FN tunneling through an oxide layer of 100 Å. Such potentials are easily achieved in conventional plasma reactors used to generate RF plasmas and semiconductor processing. Excessive FN tunneling currents eventually lead to positively charged interface traps in the oxide layer forming the gate, which can lead to subsequent dielectric breakdown.

As the semiconductor wafer is exposed to successive processing steps, the damage or potential damage is increased. As a result, efforts are made to assess the damage produced in the various semiconductor processing steps. For example, one common way to test for the level of damage is to produce test wafers or test chips comprising structures designed to measure, or allow measurement of, the damage produced by various processing steps.

Test structures are typically formed within a specifically designated test site on a semiconductor wafer being processed. Alternatively, entire wafers can be devoted to providing a plurality of test structures for process monitoring. Thus, the test structures are run through the process which results in charge build up that can be then measured. A common method for measuring the charging status is to use Capacitance-Voltage (CV) techniques or floating gate testers. Such techniques, however, are often unsatisfactory for the semiconductor industry because of their low sensitivity, high test chip cost, or long delay time associated with the production of data related to the testing.

For example, the CV method can only be used for processes with uniform charging effect. In other words, for processes that result in charge accumulating at the edge of the gate structure, CV methods will suffer from insufficient capacitance change produced by the trapped charges. The insufficient capacitance change will render conventional CV methods insufficient for monitoring the charging status.

SUMMARY

A semiconductor process test structure comprises a gate electrode, a charge-trapping layer, and a diffusion region. The test structure is a capacitor-like structure in which the charge-trapping layer will trap charges during various processing steps. Gate-Induced Drain Leakage (GIDL) measurement techniques can then be used to characterize the charging status of the test structure.

In one aspect, charge-trapping layers comprising dielectrics with different charging states near the diffusion region will result in different GIDL currents.

In another aspect, the charge-trapping layer can be an oxide-nitrite-oxide or oxide-Si-oxide structure.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 1A-1C are diagrams illustrating various views of a test structure configured in accordance with one embodiment;

DETAILED DESCRIPTION OF THE PREFERRED EMBODIMENTS

Figure 2:
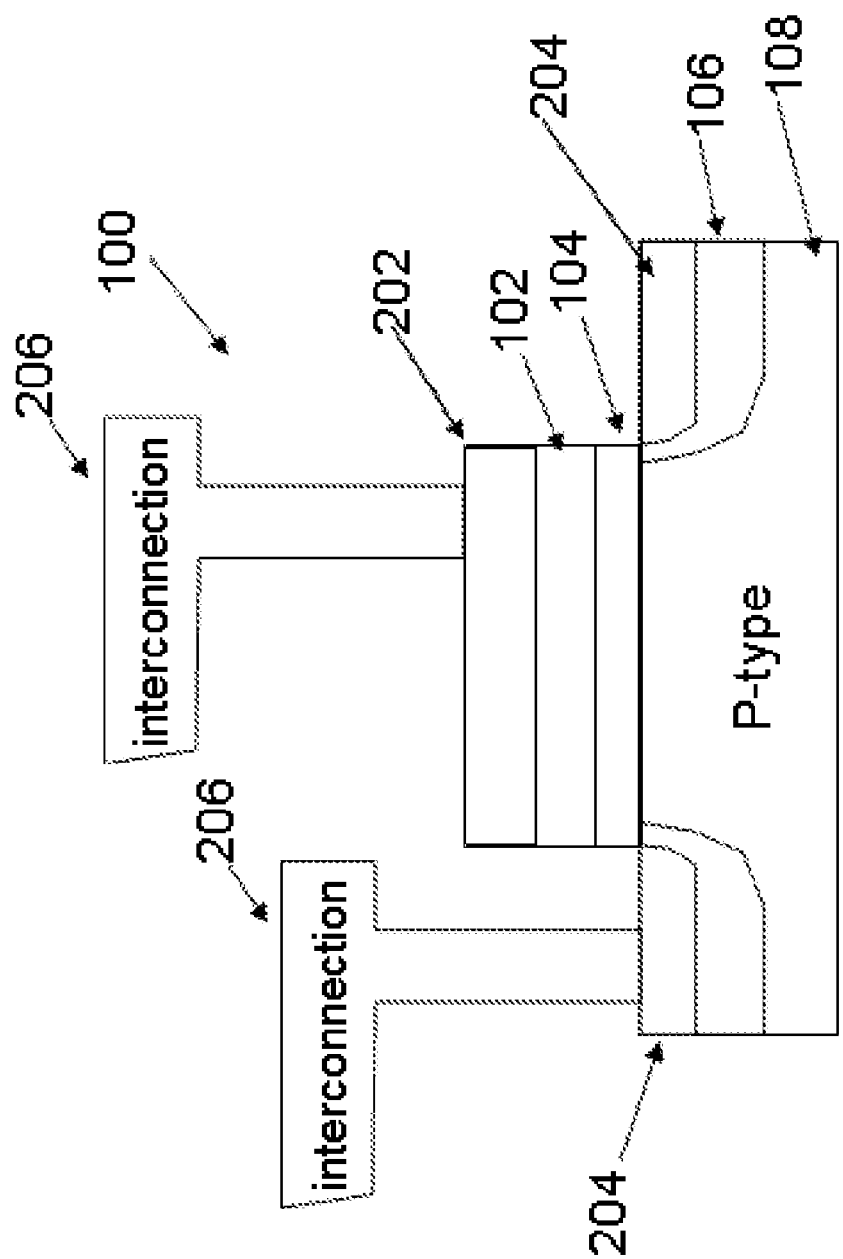
FIG. 2 is a diagram illustrating a metalized version of the test structure of FIG. 1 with test leads.

The systems and methods described herein are directed to simple capacitor-like test structures that can be used to reduce test wafer costs and shorten the delay time for producing test data that can be used to modify the semiconductor processes at issue in order to reduce damage resulting from charge accumulation during processing steps.

GIDL currents in the capacitor-like test structures are used to determine a charging status for the test structure. The GIDL currents produced and the test structures described herein are sensitive to charges in the dielectric charge-trapping layers near a diffusion region. As a result, GIDL current measurement techniques are capable of producing useful test data for both uniform and edge-charging devices.

As described above, there are many semiconductor processing steps that can induce a charging effect onto the gate dielectric layer of a semiconductor structure, causing threshold voltage shifts and/or gate dielectric degradation. For memory devices including floating gate devices, such as EEPROMs and flash devices, and charge-trapping devices, such as SONOS devices, the charging effect will result in a wide initial threshold voltage distribution, which can impact the device's operation window. The charging effect can result from various electric fields, plasmas, or radiation, such as UV light, to which a semiconductor wafer is exposed during semiconductor processing.

FIGS. 1A-1C are diagrams illustrating various views of an example semiconductor test structure 100 configured in accordance with one embodiment of the systems and methods described herein. FIG. 1A is a diagram illustrating a top view of test structure 100. As can be seen, test structure 100 comprises a gate electrode 102 and a diffusion region 106. FIG. 1B is a perspective view of test structure 100 illustrating that diffusion region 106 sits atop a substrate 108. For example, substrate 108 can be a bulk Si substrate. FIG. 1C is a diagram illustrating a cross section of test structure 100 along line A-A'. In the cross-sectional view of FIG. 1C, charge-trapping layer 104 can be seen. Charge-trapping layer can reside under electrode 102 and over diffusion region 106.

Charge-trapping layer 104 is a dielectric layer designed to trap charges within structure 100. In one embodiment, charge-trapping layer 104 comprises an oxide-nitride-oxide structure. In another embodiment, charge-trapping layer 104 comprises an oxide-Si-oxide structure, such as a SiO2-Si—SiO2 structure. In one embodiment, charge-trapping layer 104 comprises a structure with high dielectric constant materials, such as nitride, aluminum oxide, or hafnium oxide. It will be apparent, however, that any dielectric layer or structure that can be used to trap charge in accordance with the systems and methods described below can be used for charge-trapping layer 104.

Gate electrode 102 can comprise a polysilicon layer depending on the embodiment. In one embodiment, substrate 108 is a P-type substrate, while diffusion region 106 comprises an N-type region. In other embodiments, substrate 108 can be a N-type substrate, while diffusion region 106 is a P-type region.

As illustrated in FIG. 2, diffusion region 106 and gate electrode 102 can be metallized with metal layers 202 and 204 respectively. For example, in one embodiment, metal layers 202 and 204 can be metal silicide layers. Metallizing diffusion region 106 and gate electrode 102 can reduce the resistance associated with diffusion region 106 and gate electrode 102.

Testing of structure 100 can be accomplished by directly probing on diffusion region 106 and gate electrode 102. Alternatively, interconnection leads, such as interconnection lead 206, can be connected with metal layers 202 and/or 204. These interconnection leads can then be probed in order test the charging status of structure 100.

Thus, test structure 100 can be subjected to the process steps being monitored. This will result in charge being imparted to charge-trapping layer 104 during the various process steps. The charge can be imparted, as explained above, by an electric field, plasma, charge particles, radiation (UV) or other sources. The amount of charge or charge status in charge-trapping layer 104 can then be determined by probing gate electrode 102 and diffusion region 106 or interconnection leads attached thereto.

It should be noted that diffusion region 106 can be formed before or after the process steps being tested are performed depending on the embodiment.

Figure 3:
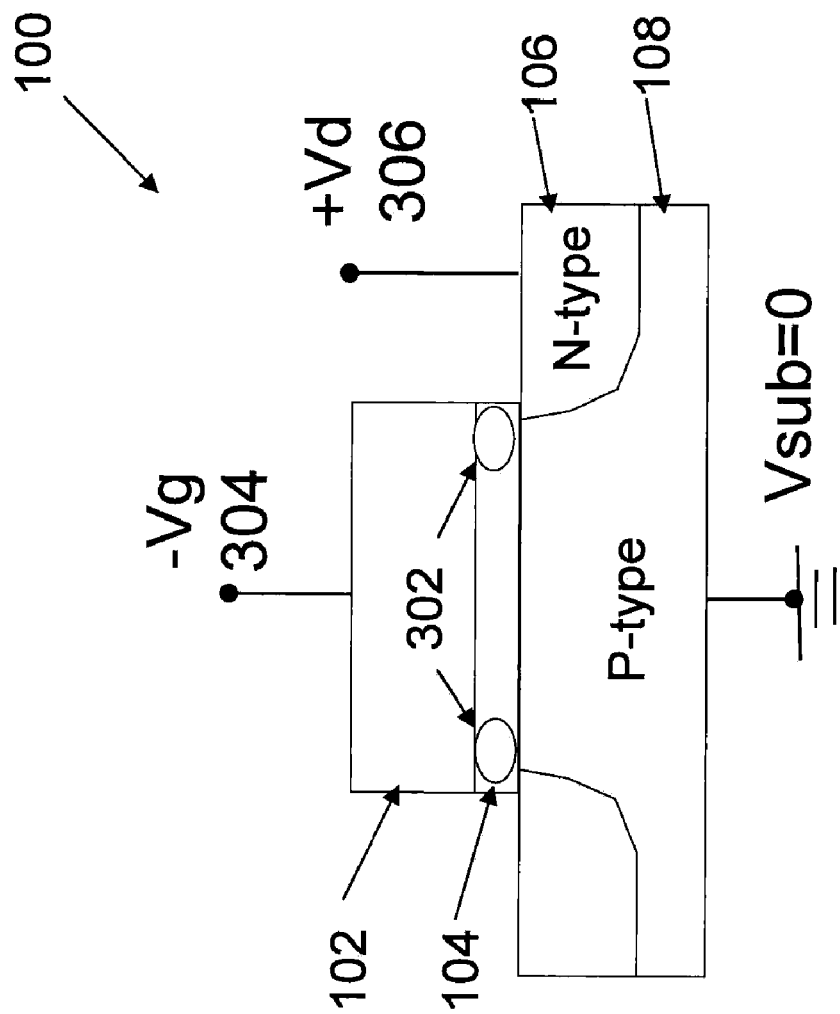
FIG. 3 is a diagram illustrating bias voltages that can be applied to the test structure of FIG. 1 in order to generate GIDL currents for measurement of charge status in accordance with one embodiment.

FIG. 3 is a diagram illustrating example voltages that can be applied to structure 100 in order to produce and measure GIDL currents within structure 100. It will be clear that the voltages applied are for a P-type substrate 108 and N-type diffusion region 106. Thus, a negative bias voltage (−Vg) 304 can be applied to gate electrode 102, while a positive bias voltage (+Vd) 306 is applied to diffusion region 106. Substrate 108 can then be grounded. For an N-type substrate 108, the polarity of the bias voltages 304 and 306 should be reversed.

Figure 4:
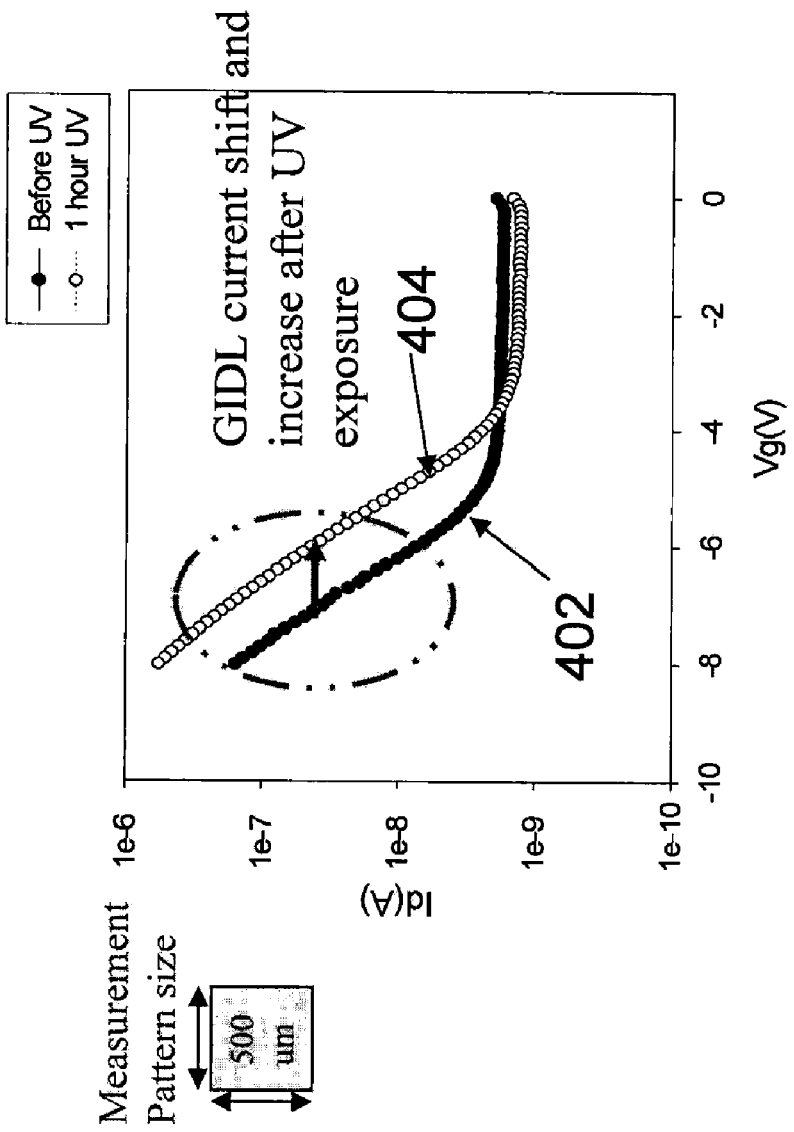
FIG. 4 is a diagram illustrating current measurements obtained using the bias voltages of FIG. 3 before and after a process step being evaluated.

Application of bias voltages 304 and 306 will cause a GIDL current to flow in test structure 100 that can be measured in order to determine shifts that result from the charging effects of the various process steps being tested. FIG. 4 is a diagram illustrating such a shift. FIG. 4 illustrates the current measured for various gate bias voltages (−Vg) 304. Curve 402 illustrates the current measured prior to test structure 100 undergoing a particular process step, while curve 404 illustrates the current measured for test structure 100 after it has undergone the particular process step. As can be seen, curve 404 has been shifted relative to curve 402 as a result of the charge imparted during the process step being tested. This information can then be used to modify the process and improve yields. As mentioned above, the test results can be achieved quickly and at little cost.

Moreover, the GIDL currents can be measured for processes that result in uniform charging or processes that result in edge charging.

Figure 5:
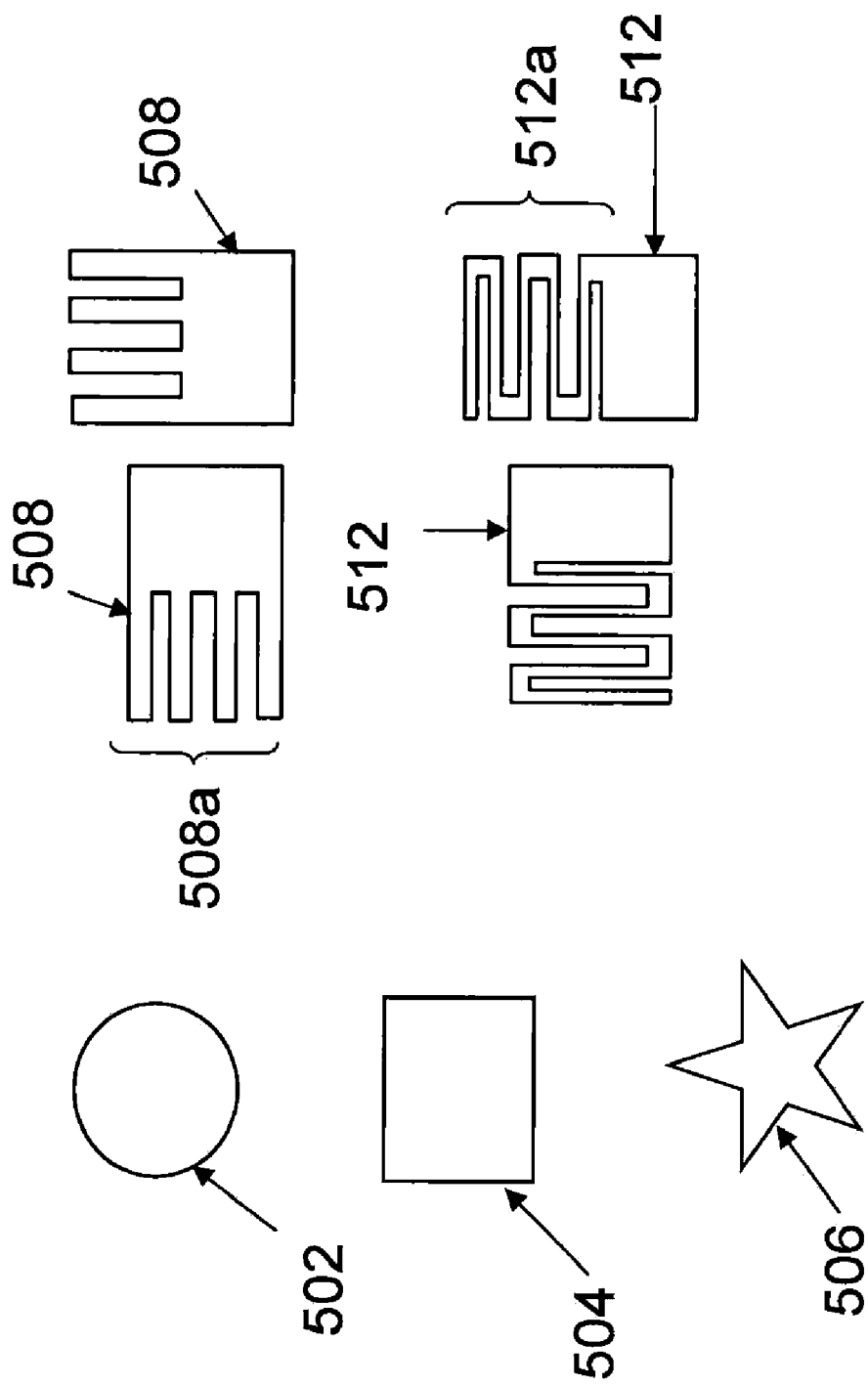
FIG. 5 is a diagram illustrating a plurality of different gate electrode shapes that can be used for the test structure of FIG. 1.

As illustrated in FIGS. 5-10, test structures comprising different test patterns can be designed for different process-monitoring purposes. For example, FIG. 5 illustrates several example shapes that can be used for gate electrode 102 depending on the embodiment. Thus, depending on the embodiment, test structure 100 can comprise a circular gate electrode 502, a square gate electrode 504, a star-shaped gate electrode 506, etc. A more complex shape can be used for gate electrode 102 depending on the process being monitored. For example, a gate electrode 508 with a plurality of fingers 508a can be used in certain embodiments of test structure 100. Other embodiments of test structure 100 can use a gate electrode 512 that includes a plurality of long lines 512a.

Gate electrodes can be configured with a different axis of orientation as well. For example, gate electrode 508 can be oriented along a horizontal axis of orientation or a vertical axis of orientation as illustrated in FIG. 5. Similarly, gate electrode 512 can be oriented along a horizontal axis or a vertical axis as required by a specific embodiment.

As would be understood, the charging effect that occurs during the various processing steps is a result of various conductive layers and areas acting like an antenna that attract charge produced during the various processing steps. Configuring gate electrodes with, e.g., long fingers 508a or long lines 512a can increase or decrease this antenna effect, which can be used to produce more relevant or accurate test data.

Figure 6:
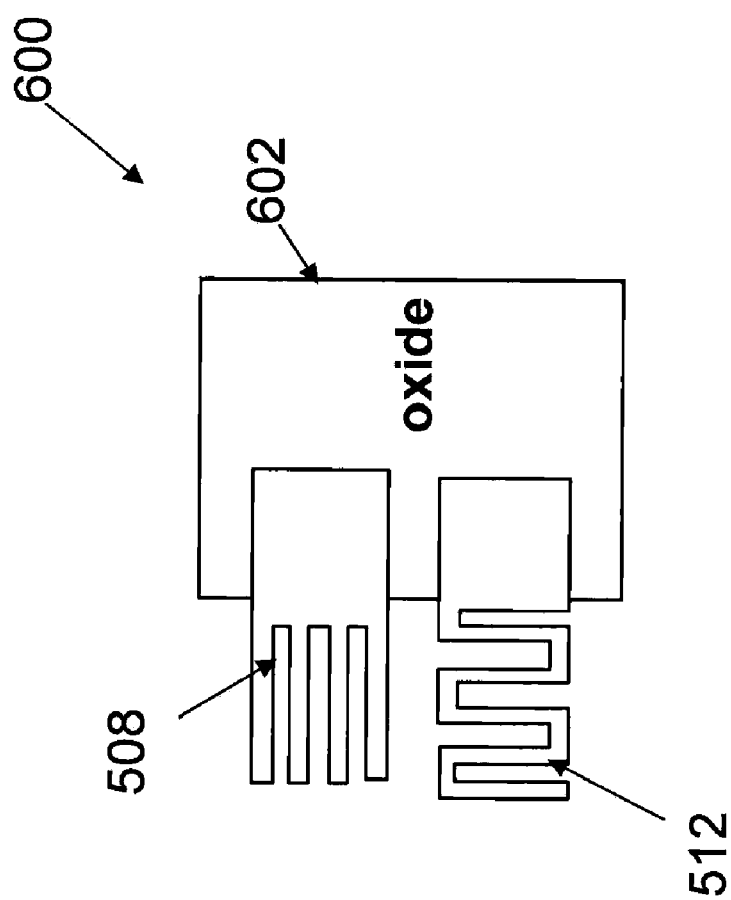
FIG. 6 is a diagram illustrating another example test structure in accordance with another embodiment.

In other embodiments, gate electrodes configured in various shapes can be combined with oxide regions in a manner configured to achieve the desired testing for different processes and monitoring purposes. For example, FIG. 6 is a diagram illustrating a gate electrode 508 and a gate electrode 512 combined with a partial oxide region 602 to form a test structure 600. Test structure 600 can, for example, be used to test for the antenna effect referred to above. In other embodiments, partial oxide region 602 can be combined with a gate electrode 508 alone or a gate electrode 512 alone. Further, in other embodiments, other gate electrodes of various shapes and orientations can be combined with oxide region 602.

Figure 7:
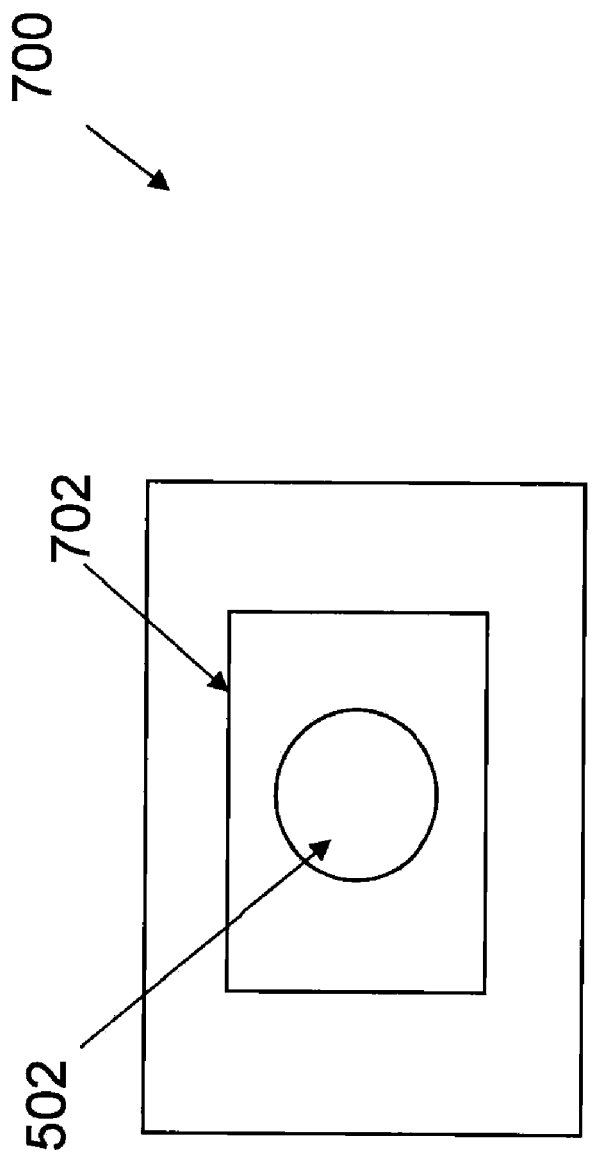
FIG. 7 is a diagram illustrating another example test structure in accordance with another embodiment.

FIG. 7 is a diagram illustrating a test structure 700 comprising a circular gate electrode 502 surrounded by an oxide region 702. Test structure 700 can be used to isolate a leakage path within test structure 700. Again, it will be clear that other gate electrodes comprising other shapes and/or orientations can be combined with oxide region 702 depending on the embodiment.

Figure 8:
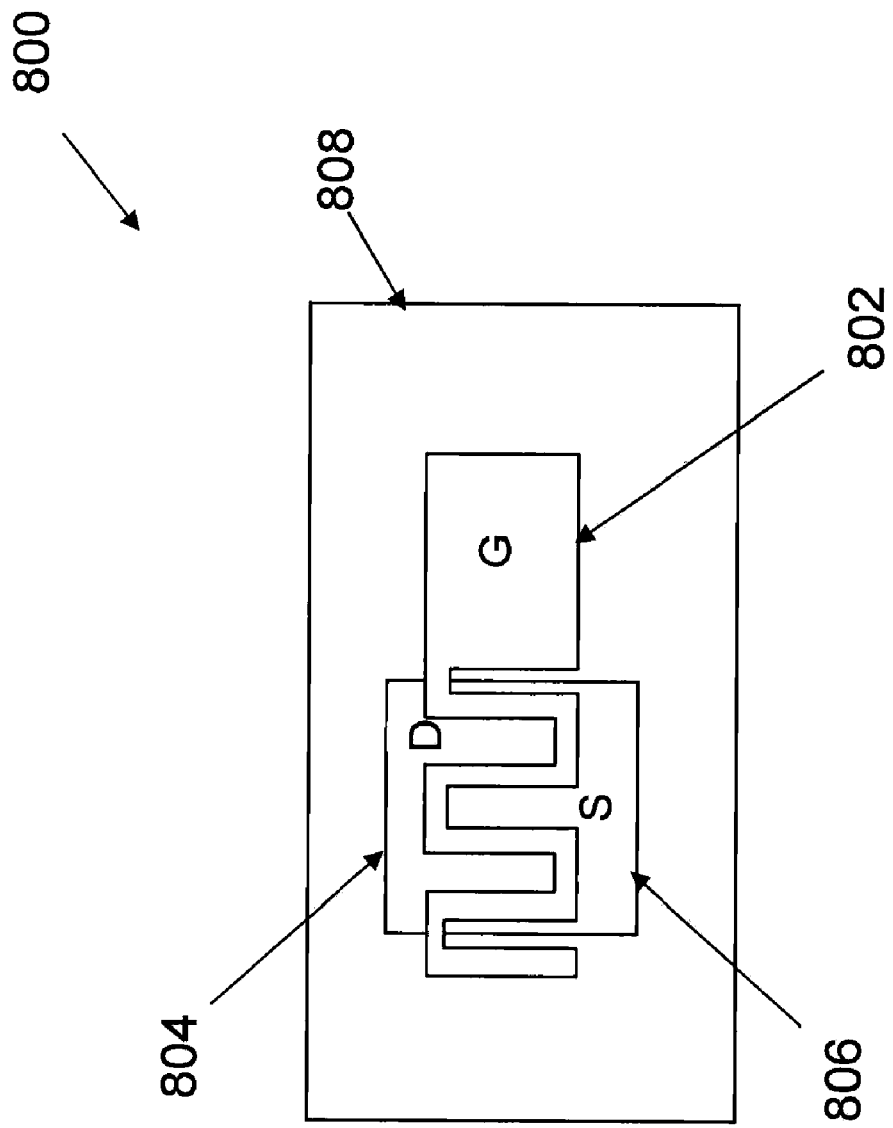
FIG. 8 is a diagram illustrating another example test structure comprising a plurality of diffusion areas in accordance with another embodiment.
Figure 9:
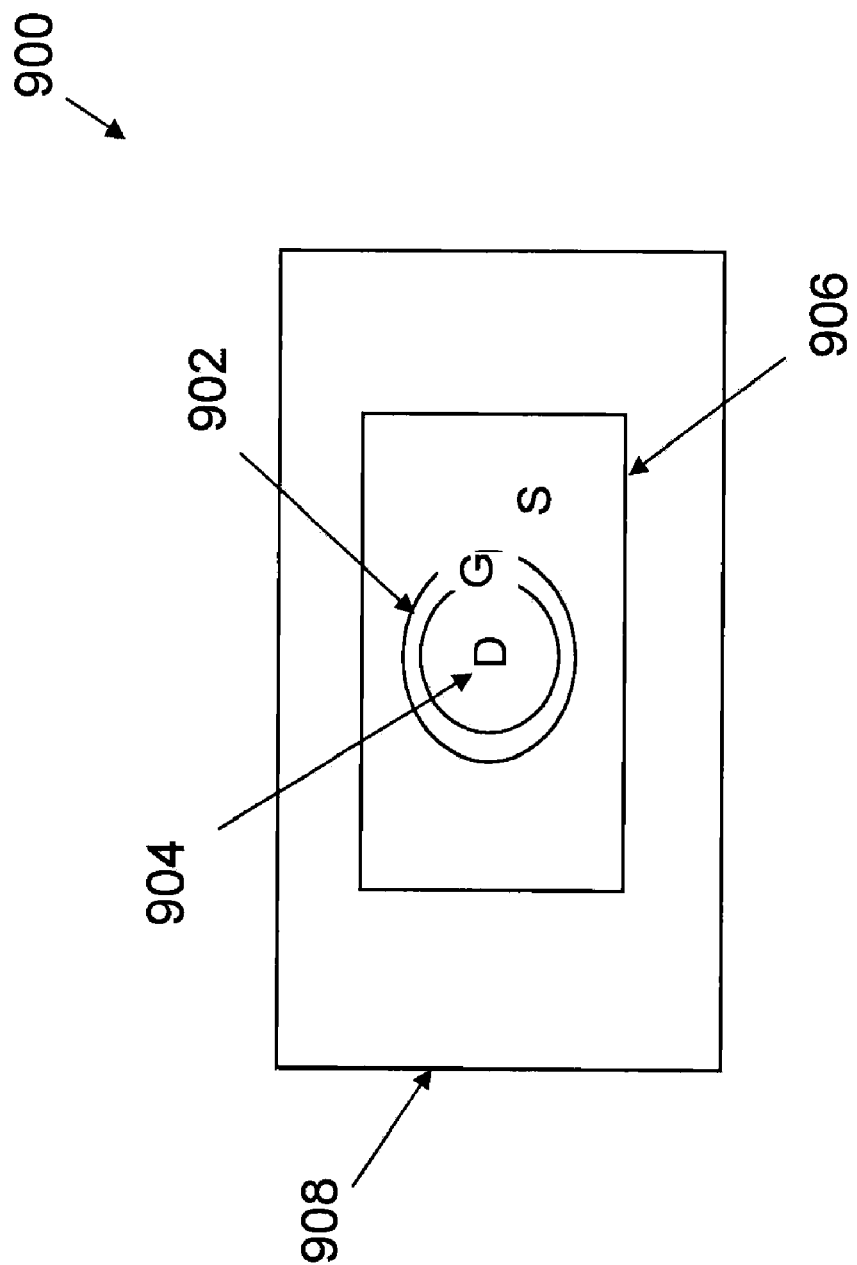
FIG. 9 is a diagram illustrating another example test structure comprising a plurality of diffusion areas in accordance with another embodiment.

In other embodiments, the diffusion region can be separated into two or more regions, e.g., by the gate electrode structure. For example, the diffusion region can be separated into source and drain regions as would be found in a MOSFET structure. FIG. 8 is a diagram illustrating an example test structure 800 comprising a gate electrode 802 separating a drain region 804 and source region 806. Drain and source region can be formed in substrate 808. FIG. 9 is a diagram illustrating another test structure 900 comprising a drain region 904 and source region 906 separated by a gate electrode 902.

Figure 10:
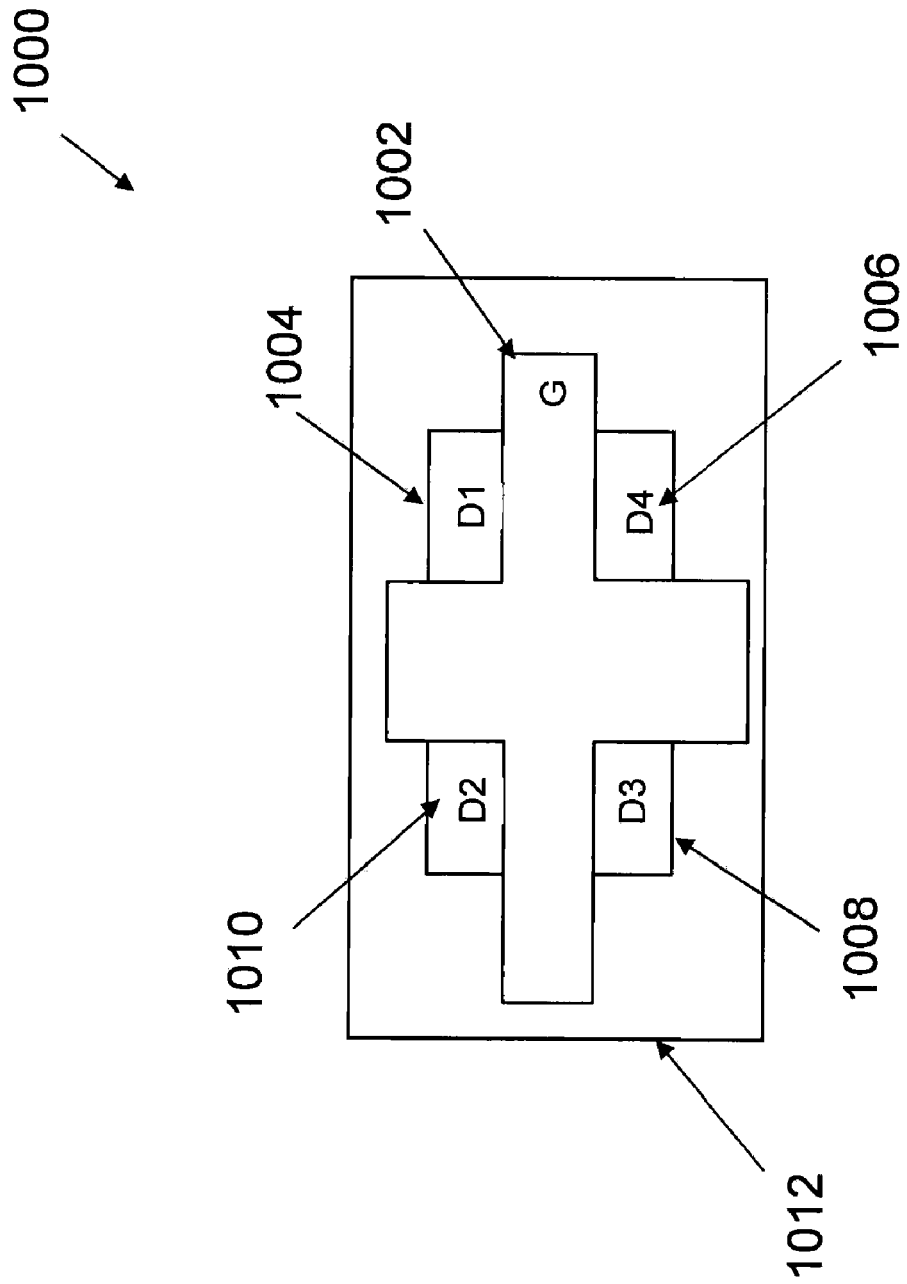
FIG. 10 is a diagram illustrating another example test structure comprising a plurality of diffusion areas in accordance with another embodiment.

It will be clear that a plurality of diffusion regions can also be included in a test structure configured as described herein. For example, FIG. 10 is a diagram illustrating a test structure 1000 comprising four diffusion regions, 1004, 1006, 1008, and 1010, separated by gate electrode 1002. In general any number of diffusion regions required to achieve the test data being sought can be included within the test structure configured in accordance with the systems and methods described herein. Further, the shape of the gate electrode can be varied as required to achieve the test data being sought and to separate the various diffusion regions.

Figure 11:
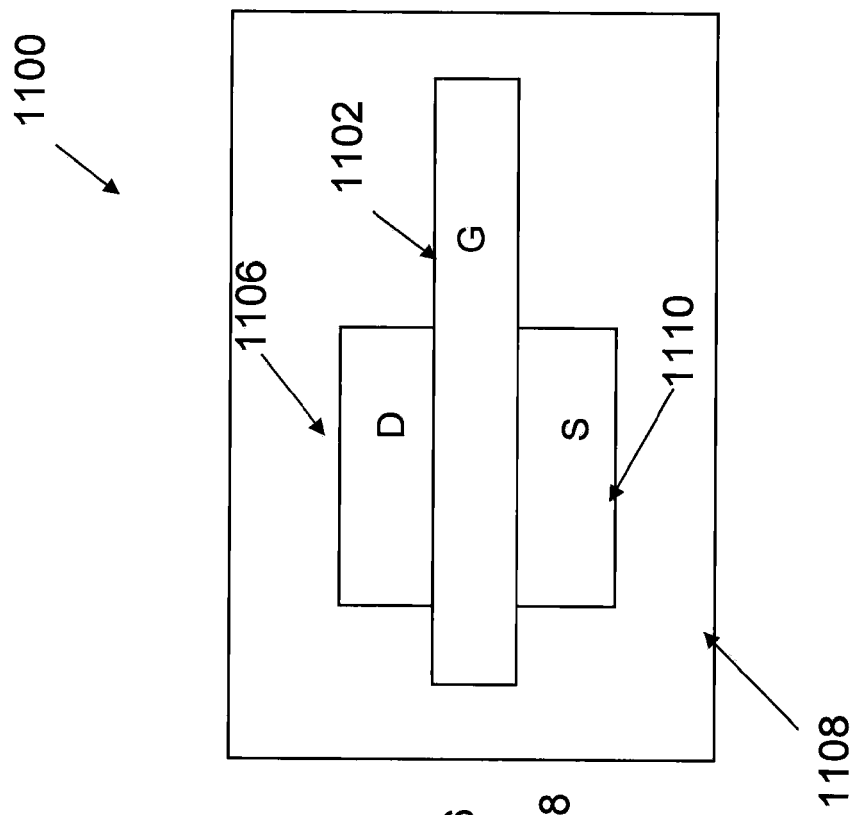
FIG. 11 is a diagram illustrating another example test structure comprising a plurality of diffusion areas in accordance with another embodiment.

When the diffusion region is separated into two or more regions, as with the embodiments of FIGS. 8-10, the charging effect can be measured for each diffusion region independently. This can be illustrated with the aid of the test structure illustrated in FIG. 11. FIG. 11 illustrates a test structure 1100 comprising a gate electrode 1102 separating a drain diffusion region 1106 and the source diffusion region 1110 formed on substrate 1108. The charge effect on drain 1106 can be determined by applying certain bias voltages to gate electrode 1102, drain 1106, and source 1110 and then measuring the resulting GIDL current. Similarly, the charge effect on source 1110 can be measured by applying certain bias voltages to gate electrode 1102, drain 1106, and source 1110 and then measuring the resulting GIDL current.

Figure 12:
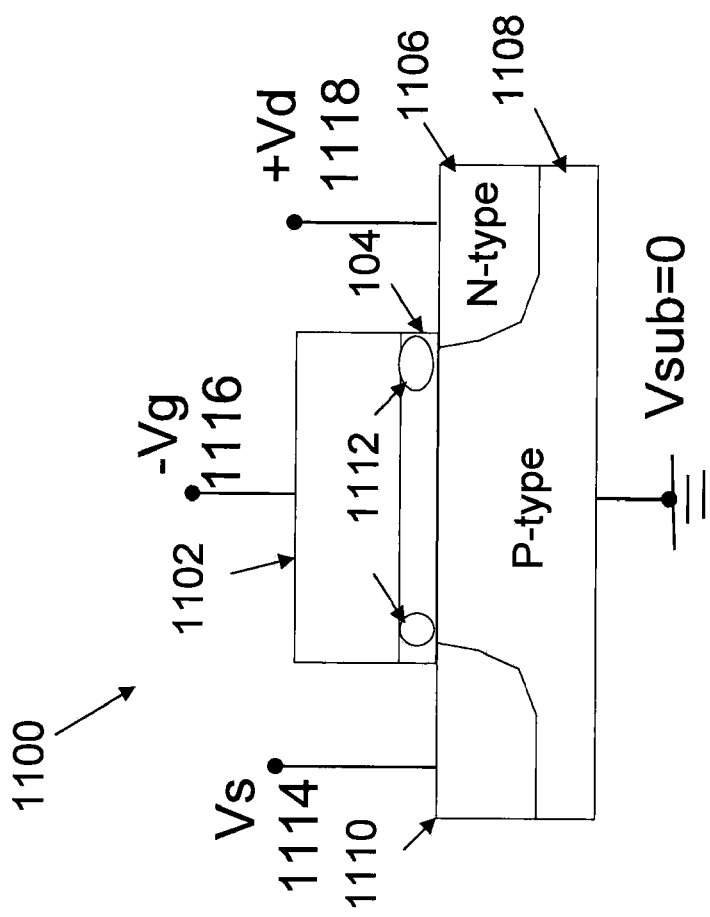
FIG. 12 is a diagram illustrating bias voltages that can be applied to the test structure of FIG. 11 in order to generate GIDL currents for measurement of charge status in accordance with one embodiment.

FIG. 12 is a diagram illustrating example bias voltages that can be applied to gate electrode 1102, drain 1106, and source 1110 in order to measure the charging effect for drain 1106 and for source 1110. In this example, substrate 1108 is a P-type substrate while drain and source regions 1106 and 1110 are N-type diffusion regions. Thus, a negative gate bias voltage (−Vg) 1116 can be applied to gate electrode 1102 and a positive bias voltage (+Vd) 1118 can be applied to drain diffusion region 1106, while source diffusion region 1110 is allowed to float and substrate 1108 is tied to ground, in order to measure the GIDL current for drain region 1106. To measure the GIDL current for source region 1110, drain region 1106 can be allowed to float, while a positive bias voltage (+Vs) 1114 is applied to source diffusion region 1110.

Figure 13:
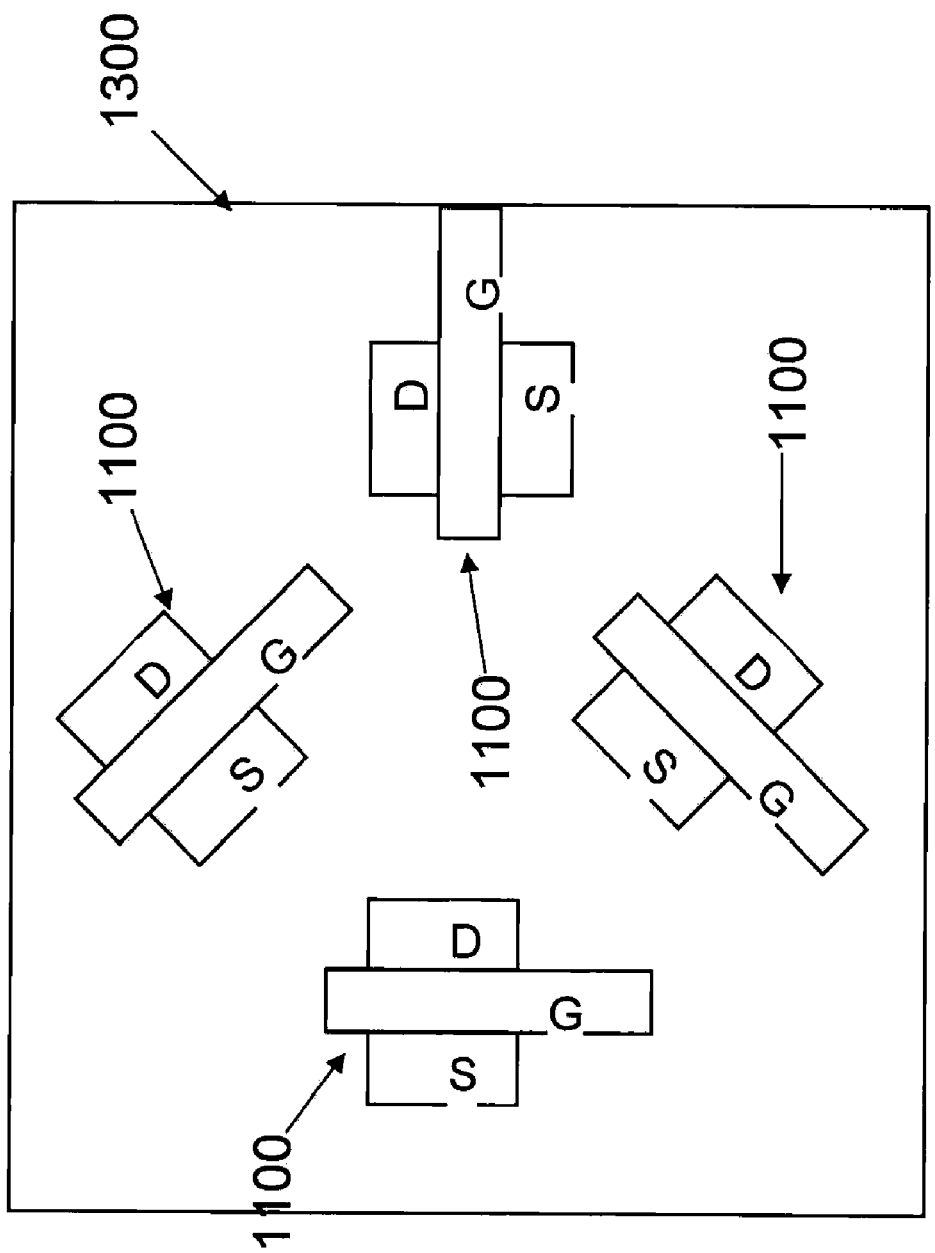
FIG. 13 is a diagram illustrating a pattern comprising a plurality if the test structures of FIG. 11.

Multiple test structures can be laid out with different orientations, e.g., in order to provide information related to an isotropic charging effect. In FIG. 13, for example, a plurality of test structures 1100 are laid out in a pattern 1300. As can be seen, test structure 1100 and pattern 1300 can have vertical, horizontal, or diagonal orientations. A pattern of test structures, such as pattern 1300 with varying orientations can be useful in providing an isotropic charging effect information. It will be apparent that other test structure patterns can comprise more or less test structures along with more or less orientations. Further, a test pattern can comprise test structures with different shapes and dimensions as well as different orientations.

Figure 14:
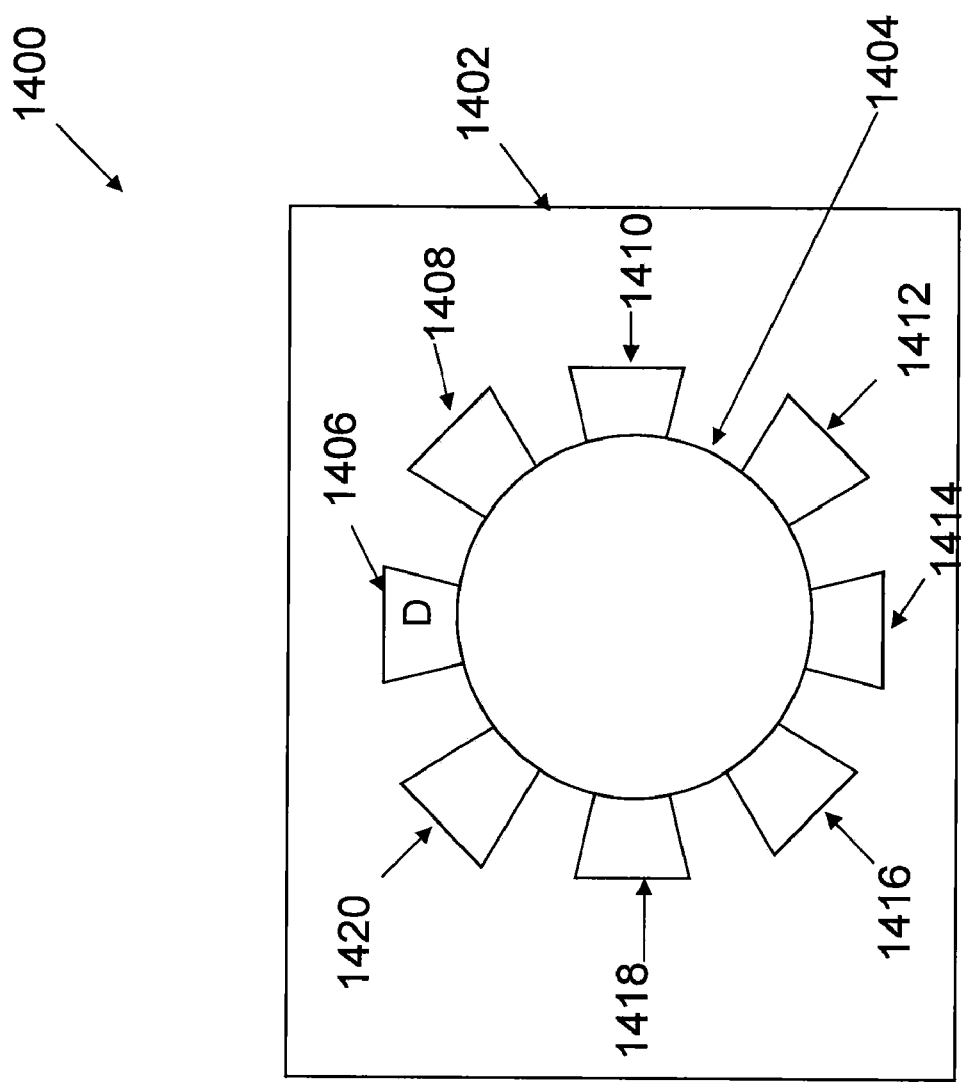
FIG. 14 is a diagram illustrating another example test structure comprising a plurality of diffusion areas in accordance with another embodiment.
Figure 15:
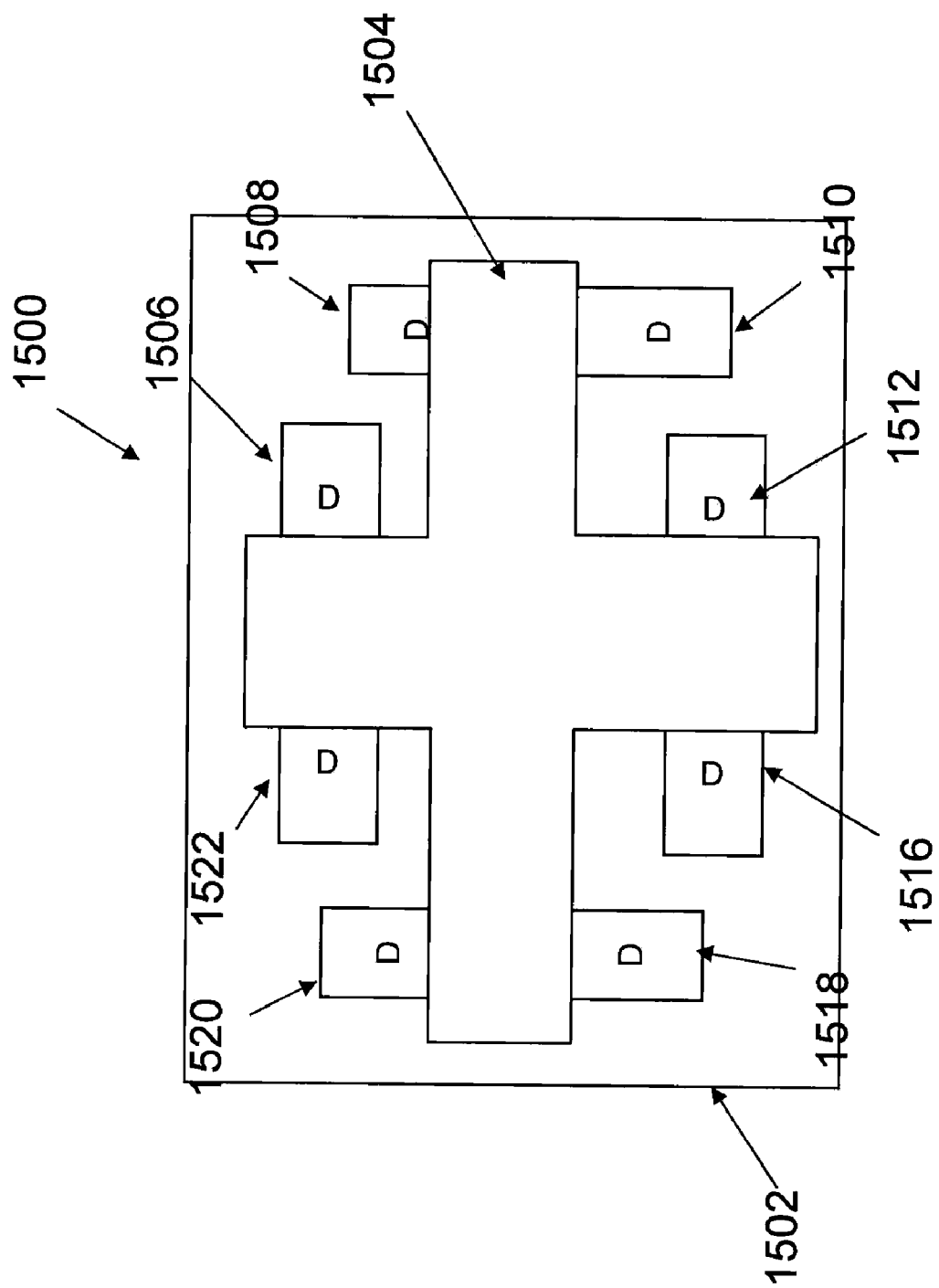
FIG. 15 is a diagram illustrating another example test structure comprising a plurality of diffusion areas in accordance with another embodiment.

As mentioned above, the size, shape, and orientation of a test structure, gate electrode, and/or diffusion regions can be varied to achieve the desired test data. FIGS. 14 and 15 illustrate two example embodiments of test structures 1400 and 1500 respectively that are slightly more complex than the previous structures illustrated above. It will be clear, however, that the embodiments described herein are by way of example only and that the particular test structures described should not be seen as limiting the systems and methods described herein to any particular test structures, shapes, orientations, or levels of complexity.

FIG. 15 is a diagram illustrating a test structure 1500 in accordance with one embodiment of the systems and methods described herein. Test structure 15 comprises a gate electrode 1504 separating a plurality of diffusion regions 1506-1522, formed on a substrate 1502. FIG. 14 is a diagram illustrating a test structure 1400 configured in accordance with another embodiment of the systems and methods described herein. Test structure 14 comprises a circular gate electrode 1404 separating diffusion regions 1406-1420 formed on substrate 1402.

A plurality of test structures, such as those described above, can be arranged on a single wafer, either in the scribe line or in the chip area, for process monitoring. As mentioned, multiple test structures can be arranged comprising different shapes and orientations. Further, one or more of the test structures can be packaged into a discreet device as a sensing element for plasma or radiation detecting.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for measuring a charge status for a test structure formed on a silicon substrate that results from a semiconductor processing step, the test structure having a gate electrode, a charge-trapping layer, and a diffusion region, the charge-trapping layer disposed between the silicon substrate and the gate electrode and directly contacting the gate electrode and silicon substrate, the method comprising:

subjecting the test structure to the semiconductor processing step causing the charge trapping layer to accumulate charge during the semiconductor processing step;

grounding the substrate; and applying bias voltages to the test structure, the bias voltages configured to generate a gate induced drain leakage current in the test structure, the gate induced drain leakage current related to the charge accumulated in the charge trapping layer of the test structure during the semiconductor processing step, wherein applying bias voltages comprises applying a first bias voltage to the gate electrode and a second bias voltage to the diffusion region, the first and second bias voltages having different polarities.

2. The method of claim 1, further comprising measuring the gate induced drain leakage current and determining a voltage threshold shift for the test structure based on the measured gate induced drain leakage current.

3. The method of claim 1, further comprising measuring the gate induced drain leakage current and determining an antenna effect based on the measured gate induced drain leakage current.

4. The method of claim 1, further comprising placing probes directly on the gate electrode and diffusion region and measuring a charge status using the probes.

5. The method of claim 1, wherein the test structure comprises interconnection leads coupled with the gate electrode and diffusion region, the method further comprising placing probes on the interconnection leads and measuring a charge status using the probes.

6. The method of claim 1, wherein the charge trapping layer comprises a dielectric layer.

7. The method of claim 1, wherein the diffusion region is a N-type diffusion region.

8. The method of claim 1, wherein the diffusion region is a P-type diffusion region.

9. The method of claim 1, wherein the gate electrode comprises fingers.

10. The method of claim 1, wherein the gate electrode comprises long lines.

11. The method of claim 1, wherein the test structure further comprises an oxide region, wherein the gate electrode is surrounded by the oxide region.

12. The method of claim 1, wherein the test structure further comprises a plurality of diffusion regions separated by the gate electrode.

13. The method of claim 1, wherein the substrate is a P-type silicon substrate.

14. The method of claim 1, wherein the substrate is a N-type substrate.

15. The method of claim 6, wherein the charge trapping layer comprises an Oxide-Nitride-Oxide dielectric layer.

16. The method of claim 6, wherein the charge trapping layer comprises an Oxide-Si-Oxide layer.

17. The method of claim 6, wherein the charge trapping layer comprises a layer with high dielectric constant material.

18. The method of claim 12, wherein the test structure further comprises a charge trapping layer between the gate electrode and the substrate and diffusion region, the charge trapping layer accumulating the charge imparted during the semiconductor processing step, and wherein the charge trapping layer accumulates a charge over each of the plurality of diffusion regions.

19. The method of claim 17, wherein the high dielectric constant material comprises any one of the materials of nitride, Al2O3, and Hf2O3.

* * * * *